United States Patent
Glasko et al.

(10) Patent No.: US 10,770,330 B2
(45) Date of Patent: Sep. 8, 2020

(54) WAFER CONTACT SURFACE PROTRUSION PROFILE WITH IMPROVED PARTICLE PERFORMANCE

(71) Applicant: ENTEGRIS, Inc., Billerica, MA (US)

(72) Inventors: John Michael Glasko, North Andover, MA (US); I-Kuan Lin, Bedford, MA (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 207 days.

(21) Appl. No.: 16/073,648

(22) PCT Filed: Feb. 2, 2017

(86) PCT No.: PCT/US2017/016145
§ 371 (c)(1),
(2) Date: Jul. 27, 2018

(87) PCT Pub. No.: WO2017/139163
PCT Pub. Date: Aug. 17, 2017

(65) Prior Publication Data
US 2019/0067069 A1   Feb. 28, 2019

Related U.S. Application Data

(60) Provisional application No. 62/293,671, filed on Feb. 10, 2016.

(51) Int. Cl.
*H01L 21/683* (2006.01)

(52) U.S. Cl.
CPC ...... *H01L 21/6833* (2013.01); *H01L 21/6831* (2013.01)

(58) Field of Classification Search
CPC .................. H01L 21/6831; H01L 21/6833
See application file for complete search history.

(56) References Cited

U.S. PATENT DOCUMENTS

| 5,903,428 A | 5/1999 | Grimard | |
| 6,897,945 B1* | 5/2005 | Ottens | G03F 7/707 |
| | | | 355/72 |
| 2005/0041364 A1* | 2/2005 | Kellerman | H01L 21/6875 |
| | | | 361/234 |
| 2009/0056112 A1* | 3/2009 | Kobayashi | H02N 13/00 |
| | | | 361/234 |
| 2013/0120897 A1* | 5/2013 | Lin | H01L 21/68757 |
| | | | 361/234 |

(Continued)

FOREIGN PATENT DOCUMENTS

| JP | 2002190512 A | 7/2002 |
| JP | 2008085129 A | 4/2008 |
| JP | 2011521470 A | 7/2011 |

(Continued)

*Primary Examiner* — Jue Zhang
(74) *Attorney, Agent, or Firm* — ENTEGRIS, Inc.

(57) ABSTRACT

An electrostatic chuck with a generally non-arcuate top surface shaped protrusions that has edge surfaces similar to a portion of a ellipse. The structure of the protrusions leads to the reduction of particulate material generated by interaction between the supported substrate and chuck. Reduced levels of scratching, abrasion, wear and particulate generation are achieved by improved smoothing and flattening of the protrusion surface.

20 Claims, 12 Drawing Sheets

(56) References Cited

U.S. PATENT DOCUMENTS

2014/0340813 A1* 11/2014 Anada ................. H01L 21/6833
361/234
2016/0049323 A1* 2/2016 Ye ....................... H01L 21/6833
361/234

FOREIGN PATENT DOCUMENTS

JP   2014027207 A   2/2014
WO   2009064974 A3   8/2009

* cited by examiner

| WAFER CONTACT AREA | ROUND TOP | FLAT TOP WITH EDGE ROUND | FLAT TOP WITH SHARP CORNER |
|---|---|---|---|
| STRESS ON THE BUMP | SMALL. DEPENDS ON CLAMP FORCE | LARGE. INDEPENDENT WITH CLAMP FORCE | LARGE. INDEPENDENT WITH CLAMP FORCE |
| | HIGH STRESS AT THE TOP | UNIFORM STRESS ON THE TOP FLAT | HIGH STRESS AT THE CORNER |
| PROCESS | POLISHING | LAPPING + EDGE ROUND POLISHING | LAPPING + LIGHT POLISHING |

Fig. 5

WAFER CONTACT SURFACE PROTRUSION PROFILE WITH IMPROVED PARTICLE PERFORMANCE

CROSS-REFERENCE TO RELATED APPLICATIONS

This application is filed under the provisions of 35 U.S.C. § 371 claiming priority of International Patent Application No. PCT/US2017/016145 filed on Feb. 2, 2017, which further claims the benefit under 35 USC 119 of U.S. Provisional Patent Application No. 62/293,671, filed Feb. 10, 2016, the disclosures of which are hereby incorporated herein by reference in their entirety for all purposes.

BACKGROUND

Substrate support chucks are widely used to support substrates within semiconductor processing systems. A particular type of chuck used in high-temperature semiconductor processing systems such as high-temperature physical vapor deposition (PVD) and reactive ion etch (RIE) is a ceramic electrostatic chuck. These chucks are used to retain semiconductor wafers, or other workpieces, in a stationary position during processing. Such electrostatic chucks contain one or more electrodes imbedded within a ceramic chuck body.

An electrostatic chuck holds and supports a substrate during a manufacturing process and also removes heat from the substrate without mechanically clamping the substrate. An electrostatic chuck has a structure that includes an electrode in a ceramic base and a surface layer of the electrostatic chuck that is activated by a voltage in the electrode to form an electric charge that electrostatically clamps a substrate to the electrostatic chuck. The electrostatic chuck can further include a plurality of protrusions or projections made from a ceramic material that supports the substrate away from the surface layer. During use of an electrostatic chuck, the back side of a substrate, such as a semiconductor wafer, is held to the face of the electrostatic chuck by an electrostatic force. The substrate is separated from one or more electrodes in the face of the electrostatic chuck by the surface layer of material that covers the electrode. In a Coulombic chuck, the surface layer is electrically insulating, while in a Johnsen-Rahbek electrostatic chuck, the surface layer is weakly conducting. Heat delivered to the substrate during processing can be transferred away from the substrate and to the electrostatic chuck by contact heat conduction with the protrusions and/or by gas heat conduction with a cooling gas. Contact heat conduction is generally more efficient than gas heat conduction in removing heat from the substrate. However, controlling the amount of contact between the substrate and the protrusions can be difficult.

Semiconductor manufacturing operations require that wafer surfaces be as clean as possible. One disadvantage of using a chuck body fabricated from a ceramic material is that, during manufacture of the support, the ceramic material is "lapped" to produce a relatively smooth surface. Such lapping produces particles that can adhere to the surface of the support. These particles are very difficult to completely remove from the surface. Additionally, the lapping process may fracture the surface of the chuck body. Consequently, as the chuck is used, particles can be continuously produced by these fractures. Also, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Japanese patent application No. 60-261377, published Dec. 24, 1985, discloses a ceramic electrostatic chuck having an embossed support surface. The embossing reduces the surface area of the ceramic support that contacts the wafer. Consequently, the number of contaminant particles transferred to the wafer is reduced. However, such an embossed surface maintains some degree of contact between the ceramic material and the underside of the wafer. Thus, contamination, though reduced, is still substantial.

There is a continuing need for wafer contact surfaces, for example those used in clamping substrates like electrostatic chucks and other articles that support substrates during processing, which minimize the amount of contaminant particles that can be produced and adhere to the underside of the substrate while supported upon the wafer contact surface.

SUMMARY

The inventors have discovered after extensive experimentation and modeling that the interaction between the substrate and the wafer contact surface's protrusions during chucking can result in a combination of normal force and shear force being exerted on the protrusions. It has been found that a greater amount of normal and shear stress is exerted on rounded or arcuate protrusions, compared to flat topped protrusions with modified edges, during clamping. It has further been found that the shear component of the chucking force between a substrate and rounded or arcuate protrusions can interact with the microcrystalline structure of the protrusion material to damage protrusions, the substrate, or both, and create particles. This problem can be greatest in arcuate or rounded protrusions where the microcrystallites of the material forming the protrusions are aligned substantially perpendicular to the chuck's wafer contact surface layer.

Versions of the wafer contact surface, and in particular an electrostatic chuck with the wafer contact surface described herein comprise or include protrusions extending above the surface layer of the electrostatic chuck that support a substrate during chucking. While the term protrusion is used in the specification and claims, the terms mesa, handler surface, bump, embossment, projection or similar term can be used interchangeably with protrusion. In addition, the structure of the edge surface and materials used for protrusions can also be used for other electrostatic chuck surface features including, but not limited to lift pin seals, and gas seal rings.

Versions of an electrostatic chuck comprise an electrode in a ceramic base, a surface layer on the ceramic base of the electrostatic chuck that is activated by a voltage in the electrode to form an electric charge that electrostatically clamps a substrate to the electrostatic chuck. The surface layer of the electrostatic chuck comprises a plurality of protrusions which form the wafer contact surface. The protrusions comprise a composition whose morphology is columnar or granular, and whose microstructure is crystalline or amorphous. The protrusions can extend to an average height H above the surface layer surrounding the protrusions, the protrusions support the substrate upon the protrusions during electrostatic clamping of the substrate. A cross section of the protrusions have a structure characterized by a non-arcuate plateau shaped top surface, an edge surface, and a side surface. The non-arcuate plateau shaped top surface of the protrusions has a length L in microns that is characterized by a flatness parameter $\Delta$ in microns. The top surface has a surface roughness $R_a$ of 1 micron or less and a value of $(\Delta*100)/L$ that is less than $\pm 0.01$.

Versions of the wafer contact surface can be used for clamping a substrate to the chuck. Versions include a method for reducing contamination to a workpiece supported by the wafer contact surface, the method comprising: creating a force, such as an electrical field, substantially parallel to a surface of the chuck adjacent to a protrusion portion on a surface of the chuck whose protrusions have a cross section structure characterized by a non-arcuate plateau shaped top surface, an edge surface, and a side surface. The non-arcuate plateau shaped top surface of the protrusions has a length L in microns that is characterized by a flatness parameter $\Delta$ in microns. The top surface has a surface roughness $R_a$ of 1 micron or less and a value of $(\Delta*100)/L$ that is less than $\pm 0.01$. The edge surface of the protrusion is between the top surface and the side surface of the protrusion has an edge surface profile that lies on or within a quadrant or portion thereof of an ellipse. The minor axis Y of this ellipse intersects an edge of the flat surface of the protrusion where the value of $(\Delta*100)/L$ is equal to or greater than $\pm 0.01$, and the minor axis apex of the ellipse lies along the top surface of the protrusion. The value of Y/2 is 0.5 microns or less. The major axis X of the ellipse is substantially parallel to the top surface of the protrusion and the value of X/2 is between 25 microns and 250 microns.

A cross section of other structures on the wafer contact surface that contact the substrate, such as a gas seal ring and lift pin seals, can also have a structure characterized in cross section by a non-arcuate plateau shaped top surface, an edge surface, and a side surface. The non-arcuate plateau shaped top surface of the gas seal ring or lift pin seals has a length L in microns that is characterized by a flatness parameter $\Delta$ in microns. The top surface has a surface roughness $R_a$ of 1 micron or less and a value of $(\Delta*100)/L$ that is less than $\pm 0.01$.

The edge surface of the protrusion is between the top surface and the side surface of the protrusion has an edge surface profile that lies on or within a quadrant or portion thereof of an ellipse. The minor axis Y of this ellipse intersects an edge of the flat surface or a portion of the top surface of the protrusion where the value of $(\Delta*100)/L$ is equal to or greater than $\pm 0.01$, and the minor axis apex of the ellipse lies along the top surface of the protrusion. The value of Y/2 is 0.5 microns or less. The major axis X of the ellipse is substantially parallel to the top surface of the protrusion and the value of X/2 is between 25 microns and 250 microns.

The edge surface of other wafer contacting structures on the chuck, which can for example be an electrostatic chuck, such as a gas seal ring or lift pin seals is also between the top surface and the side surface of these structures and can have an edge surface profile that lies on or within a quadrant or portion thereof of an ellipse. The minor axis Y of this ellipse intersects an edge of the flat surface or a portion of the top surface of the gas seal ring or lift pin seal where the value of $(\Delta*100)/L$ is equal to or greater than $\pm 0.01$, and the minor axis apex of the ellipse lies along the top surface of the gas or lift pin seal. The value of Y/2 is 0.5 microns or less. The major axis X of the ellipse is substantially parallel to the top surface of the gas or lift pin seal and the value of X/2 is between 25 microns and 250 microns.

The side surface of the protrusions, lift pin seal, or gas seal connects the edge surface and the surface layer. The non-arcuate top surface of the protrusion, lift pin seal, or gas seal ring can be a plateau or a substantially flat surface.

BRIEF DESCRIPTION OF THE DRAWINGS

FIG. 5 illustrates and summarizes the forces, wafer contact area, and process of finishing protrusions made from a material like yttrium aluminum garnet (YAG) which has a columnar structure. The protrusions illustrated have (a) a round top, (b) a flat top with an edge round, and (c) a flat top with a sharp corner.

DESCRIPTION

Figure 1:
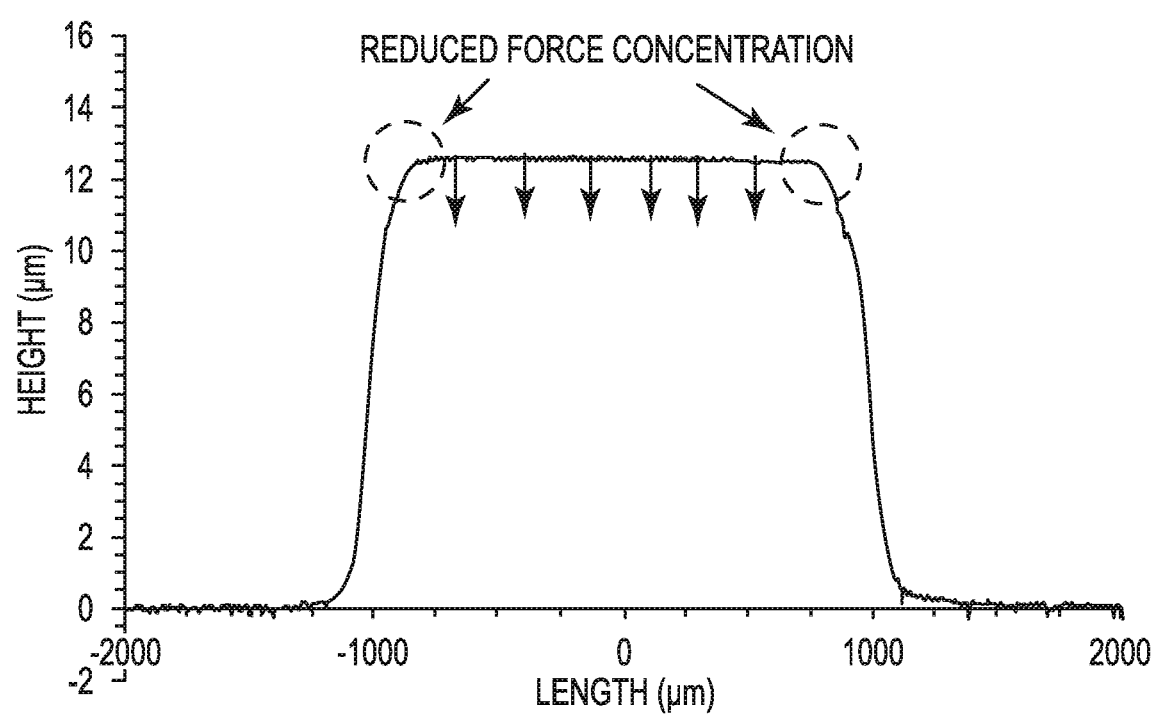
FIG. 1 illustrates a substantially flat top, round edge protrusion, and shows the normal force vectors.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to an "protrusion" is a reference to one or more protrusions and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

The protrusions on the surface layer of the chuck, which can be an electrostatic chuck or vacuum chuck, can be equally spaced, or not. There are situations in the layout of a chuck where it may be desired to change areal protrusion density, protrusion pattern layout, spacing, or even protrusion diameter in specific areas/regions of a chuck because of pre-existing features on the chuck that need to be accommodated such as near the gas seals and lift pin seals. Regions of the protrusions on the surface layer can have protrusions with a "regular equally spaced arrangement", for example a hexagonal pattern or a trigonal pattern. Partial protrusions (for example half of a cylinder, a quarter of a cylinder, and other shapes) can also be used on the surface of the electrostatic chuck and can have an edge surface profile as disclosed herein.

The side surface of the protrusion connects the surface layer with the edge surface profile. In some versions the "verticality" of the side surface can vary from 80 degrees to 175 degrees from the surface layer. For example, in FIG. 10 where the protrusion side surface 1040 is essentially perpendicular to the surface layer 1030, the side surface 1040 makes a 90 degree angle with the surface layer 1030. Whereas in FIG. 11, where the protrusion side surface 1140 is not perpendicular to the surface layer 1130, the side surface 1140 makes a greater than 90 degree angle, for example between 90 degrees and 175 degrees, with the surface layer 1130.

The non-arcuate plateau shaped top surface of the protrusions has a length L in microns and a structure that is characterized by a flatness parameter Δ in microns. The non-arcuate top surface has a surface roughness $R_a$ of 1 micron or less and a value of (Δ*100)/L that is less than ±0.01. In the case of lift pin seals or a gas ring seal, the non-arcuate top surface of these seals can also have a surface roughness $R_a$ of 1 micron or less and a value of (Δ*100)/L that is less than ±0.01.

Protrusion shape is not limited. As viewed from the top, the protrusions can for example be circular, elliptical, rectangular or other polygon. The top area of the protrusion can be smaller or larger than the base. A contact area of the protrusions with the substrate may comprise from about 1% to about 10% of a total area of the electrostatic chuck. The protrusions may have a diameter of from about 0.75 millimeters to about 3 millimeter. The center to center distance between pairs of neighboring protrusions may be less than about 20 millimeters, or less than about 10 millimeters, or less than about 8 millimeters, or less than about 6 millimeters, or less than about 4 millimeters, or less than about 2 millimeters. In some versions the center to center distance between protrusions can be between 1 micron and 20 microns. The protrusions may include at least one partial protrusion, the partial protrusion comprising at least part of a wafer or substrate contact surface structure. The surface structures may be selected from at least one of a gas channel, a lift pin, a ground pin, protrusion, or any combination of one or more of these. The height of the protrusions may be substantially equal to the mean free path of a gas located during the clamping in a space between the substrate, the protrusions, and the portions of the surface layer surrounding the protrusions. In some versions the protrusion height on the wafer cibtact surface are substantially the same and may range from 5 microns to 20 microns. In versions of the wafer contact surface, the heights and cross section of the gas seal and lift pin seals are substantially the same as the heights and cross section of the protrusions.

Materials forming all or a portion of the protrusion can be softer than the substrate that the protrusions support. For example the protrusion can be made entirely of physical vapor deposited aluminum oxynitride or may be a coating of aluminum oxynitride overtop of an underlying ceramic like alumina. In some versions the materials forming the protrusions have a microstructure that has crystallinity and the materials are not amorphous. In some versions the protrusion material has a columnar structure. Examples of materials that can be used for protrusions that support silicon substrates or wafers can include but are not limited to yttria ($Y_2O_3$), yttrium aluminum garnet, alumina ($Al_2O_3$), or aluminum oxynitride.

In some versions the protrusion composition has a morphology that is columnar or granular, and microstructure can be crystalline or amorphous. For example, as measured by x-ray diffraction (XRD), a YAG composition can be made that is amorphous (essentially zero crystallinity) while a yttria composition can be made that has nanometer and micron-size crystallites. Scanning electron microscopy (SEM) can be used to analyze the microstructure of protrusions, and for example SEM can be used to show that both YAG and yttria can have a columnar morphology.

X-ray diffraction (XRD) can be used to characterize the structure of the protrusion(s), gas seal ring, or lift pin seal material. Protrusions, gas seals, or lift pin seals that are comprised of a microcrystalline material will have an XRD diffractogram that has slightly broader peaks than the XRD diffractogram of a poly crystalline material, and the crystallite size can be calculate by Williamson-Hall plot. In some versions of the wafer contact surface, or contact surface of the electrostatic chuck, the protrusions, gas seals, or lift pin seals are formed using a low temperature physical vapor deposition (PVD) process and the material has a microcrystalline structure, which has various crystallite sizes embedded in amorphous matrix. In some versions the protrusions, gas seals, or lift pin seals are formed using a low temperature PVD process and the material has low or substantially zero crystallinity. The columnar or granular structure of the protrusion, gas seals, or lift pin seals can also be determined based on an SEM analysis of the material.

The surface line characterizing the protrusion top surface can be the baseline (average surface or mean line) against which roughness is measured. The tallest part of a protrusion along this mean line that is above the mean line is $H_{max}$, and the deepest valley is $H_{min}$. $H_{max}$–$H_{min}$ is referred to as $R_{max}$, the maximum deviation from the mean line. The term Ra, an often-used measure of surface roughness, is the arithmetic average of the absolute values of the deviations from this mean line. Surface roughness and surface profiles can be measured using a stylus profilometer (with a fixed tip radius). Non-contact methods, such as laser confocal microscopy, can be used to profile and evaluate surface roughness (area and or linear) of protrusions and other electrostatic chuck surface structure. In some cases two representative mean lines can be used to define the top surface plane of a protrusion.

Protrusions, gas seals, or lift pin seals in version of the wafer contact surface have a substantially flat top surface or plateau of length L, with an average height H above the electrostatic chuck field level. The top surface of these structures lie in a plane that is substantially parallel to the major axis of the ellipse that defines the edge rounding on the protrusion or other seal structures. The major axis of the ellipse that defines the edge rounding on the protrusion is also substantially parallel to the surface layer or field of the electrostatic chuck. The average height of the top surface of the protrusion above the surface layer or field level can be substantially the same height or slightly larger than the topmost point of the minor axis of the ellipse that defines the edge rounding.

Ellipses have two perpendicular axes about which the ellipse is symmetric. These axes intersect at the center of the ellipse due to this symmetry. The larger of these two axes, which corresponds to the largest distance between antipodal points on the ellipse, is called the major axis. The smaller of these two axes, and the smallest distance across the ellipse, is called the minor axis.

Figure 10:
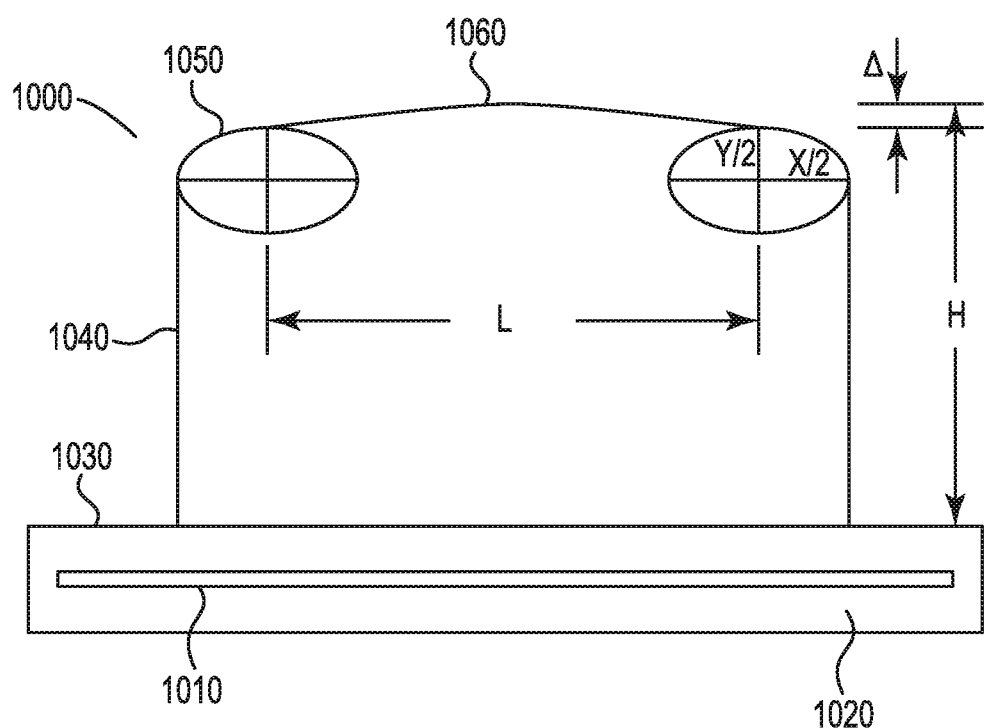
FIG. 10 illustrates an electrode in a ceramic base and a version of a protrusion atop the surface layer of the electrostatic chuck with a substantially flat top surface, edge surfaces, and one or more ellipses describing the protrusion edge profile.

The edge surface profile of a cross-section of protrusions and other features like gas seals and lift pin seals can be on or fall substantially within the two ellipse as shown in FIG. 10 that have X and Y axis values that are within ±10% of each other. Protrusions with a flat top and a sharp or essentially square corner (cross-section) have high stress at the corner and the edge surface profile of these sharp corners is not within or on the two ellipse illustrated in FIG. 10 and FIG. 11.

A numerical model (FEA) was used to analyze silicon wafer deformation during clamping on a YAG (yttrium aluminum garnet) embossment or protrusion.

Figure 2:
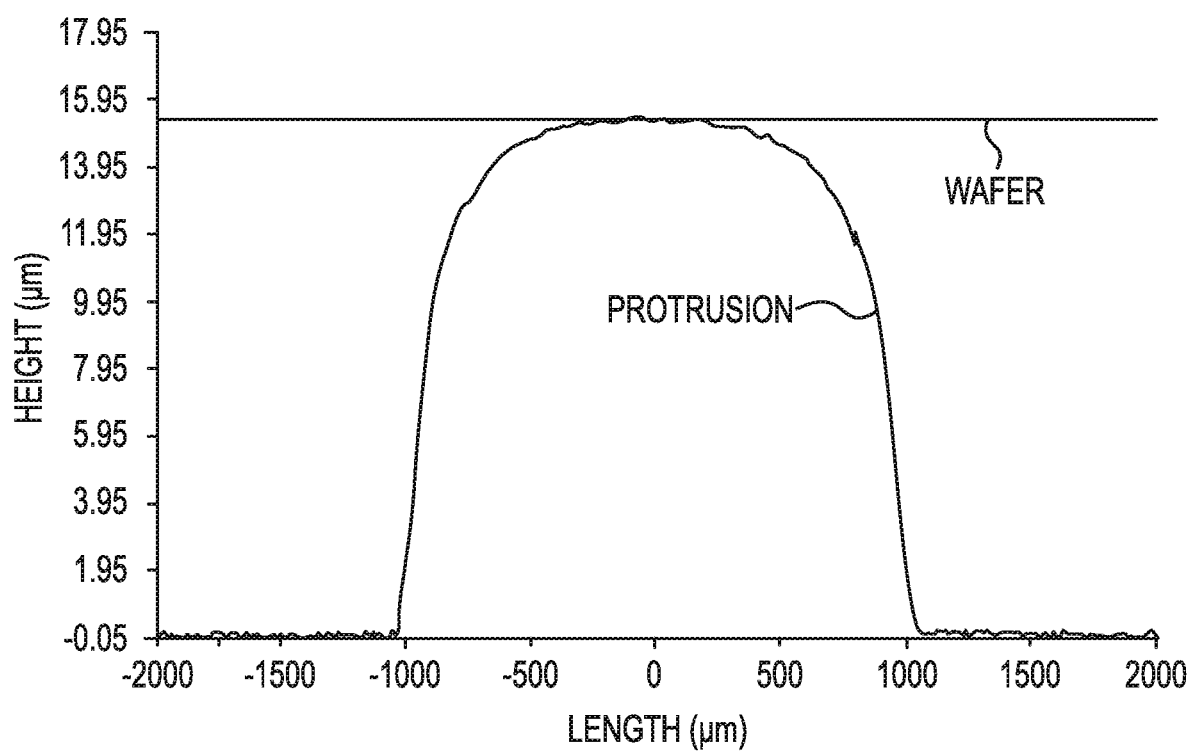
FIG. 2 illustrates a wafer clamped to and interacting with an arcuate shaped protrusion with a force of about 75 Torr.

FIG. 2 Illustrates a wafer clamped and interacting with an arcuate shaped protrusion. The wafer only has minor sagging (Max deformation is 40 nm for a 10 millimeter protrusion center to center spacing), when the clamp force is 75 Torr (10 k $N/m^2$). The result shows that the wafer cannot comply with the protrusion profile during clamping.

Figure 3:
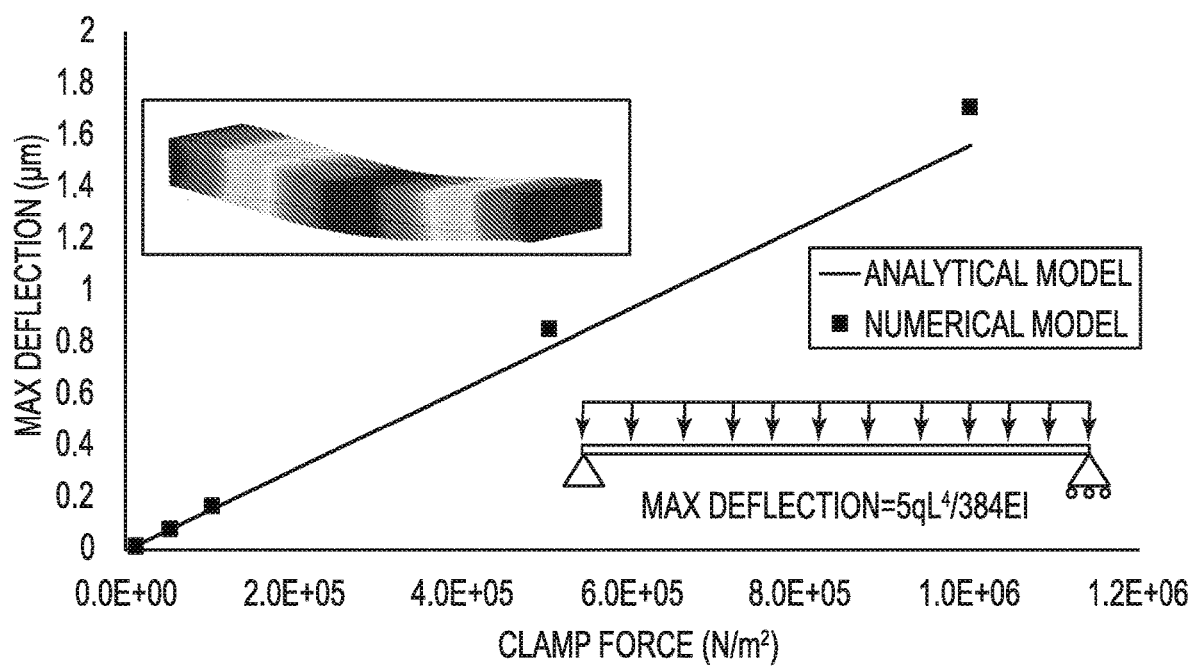
FIG. 3 illustrates a silicon beam deflection graph where the beam endpoints are spaced 10 millimeters apart.

A numerical model (finite element model) was used to calculate the deflection of a silicon beam under a uniform loading and the results shown in FIG. 3. The numerical result agrees with analytical result. The wafer doesn't deform significantly at 75 Torr clamp force. The max deflection of silicon beam is 17.2 nanometers.

Figure 4:
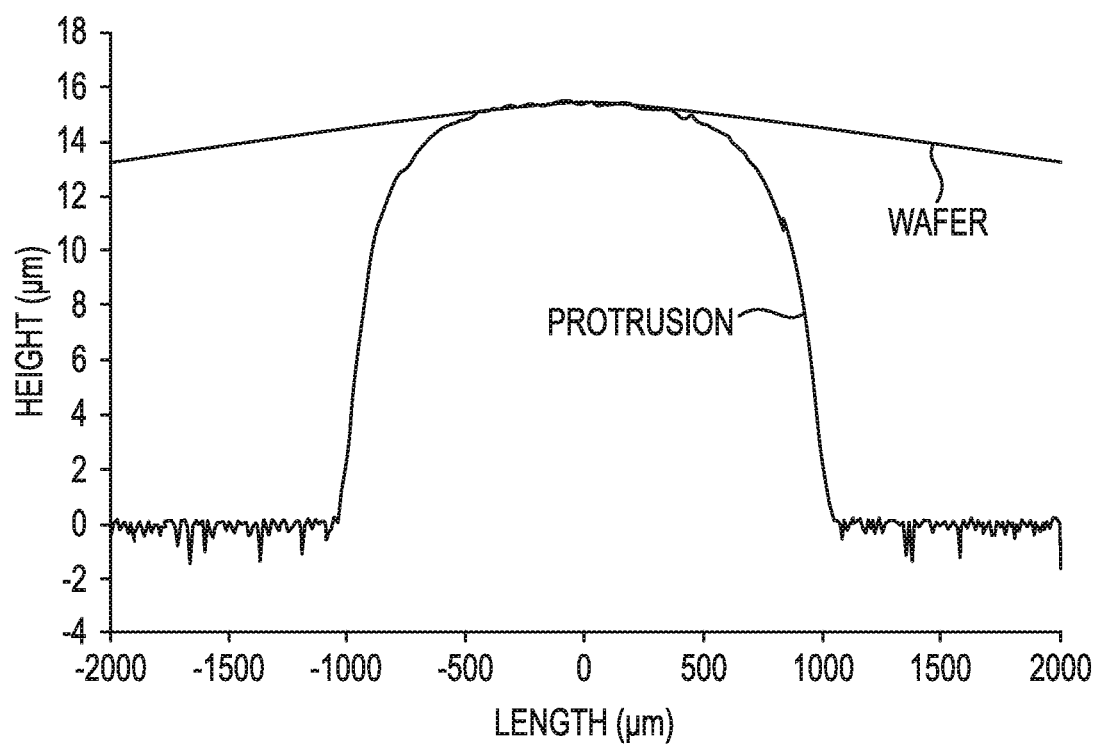
FIG. 4 illustrates a wafer clamped to and interacting with an arcuate shaped protrusion with a high clamp force of about 7500 Torr.

The max wafer sagging is ~4 um, assuming the chuck has extreme high clamp force which is 7500 Torr (1M $N/m^2$). Under these conditions, illustrated in FIG. 4, the wafer still can not fully comply with the arcuate protrusion profile during clamping and only ~1 mm-diameter area on the top of the protrusion contacts wafer. The stress (300 MPa) on the wafer around the protrusion under these conditions is close to the fracture stress (700 MPa) of silicon and is expected to lead to particle generation.

Additional simulations or modeling studies suggested that contact was maintained with a substrate across the entire protrusion surface when the protrusion surface is flat or has a plateau. Further, the modeling showed that the substrate does not appear to lift up in the center of a flat protrusion, as suggested in WO 2009/064974 A2.

This example shows that a silicon wafer cannot fully comply the profile of round-top (arcuate) protrusion, which causes high stress at the top of the protrusion. If the clamp force of an electrostatic chuck is 75 Torr (10 k Pa), the max deformation of wafer between protrusions of a wafer contact surface with a 10 mm center to center spacing is only 40 nm. The result of the analysis further showed that there are not only normal force but shear force on the round-top protrusion during clamping. In contrast, there is only or substantially only normal force on the flat-top protrusion. The high stress and shear force can damage protrusions and create particles, the damage will be greater if the protrusion material has a microcrystalline or columnar morphology. The flat-top protrusion with edge round has uniform stress on the top and reduced stress concentration at the edge. Based on this study and the fact that YAG has a columnar structure when deposited using a low temperature (less than 200° C.) PVD process, a flat-top protrusion with a surface roughness $R_a$ of less than 1 micron and an edge round (see center diagram below in FIG. 5 where Y is 1 micron, X is 275 microns, and L is 1435 microns) for YAG embossment would generate the least particles and reduced damage to a supported silicon wafer.

Figure 6:
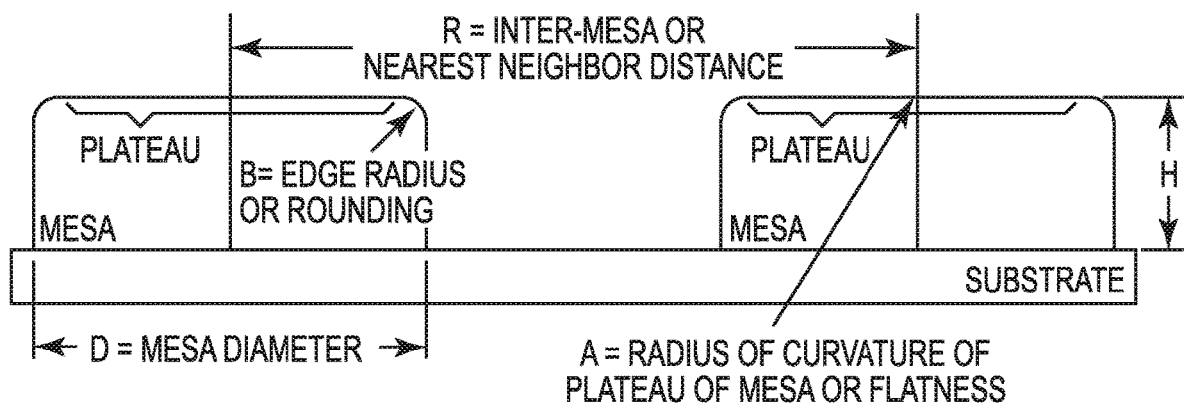
FIG. 6 illustrates various features of protrusions or mesas including diameter (D), plateau, height, edge radius or rounding parameter, radius of curvature or flatness, center to center nearest neighbor distance, protrusion or mesa shape (may also be elliptical/oval, square, rectangular, etc), and protrusion distribution on the electrostatic chuck surface.

Semiconductor processing/metrology tools utilize wafer immobilization technologies to secure and manipulate wafers in process chambers and metrology tools. These technologies can use forces that include vacuum-based for securing the wafer or substrate by evacuating a closed volume behind a wafer, electrostatic (ESC) in nature (whereby the wafer is immobilized or secured by applying a high voltage to an electrostatic clamp assembly of which the wafer behaves as an electrode), or other physical means (ex—edge grip chucks). In each case, where a force is exerted on the wafer (or other substrate), bringing the wafer into contact with the substrate contact surface, the potential exists for transferring particulate contamination from the wafer backside to the chuck's wafer contact surface, or from the wafer contact surface back to the wafer. For critical wafer clamping applications, where particulate transfer is negatively impactive to the process at hand and or the end product, a common and simple approach to reducing particle transfer has been to limit the area of the wafer that directly contacts a wafer chuck clamp surface. This can be achieved as illustrated in FIG. 6 by creating a distribution of raised areas or surface features on the chuck surface (mesas, projection, protrusion, embossment, or bump) of some diameter (D) or physical size (may also be elliptical/oval, square, rectangular, etc) with an inter-mesa (nearest neighbor) distance R, arranged in a pattern that meets the requirements of the given application. Patterns can be trigonal, hexagonal, square, circular, etc.

Reducing the opportunities for particle exchange between chucking surfaces can improve particle performance, material properties of the wafer contact surface relative to the material properties of the material to be clamped. The shape/profile of the contact surface features, can also impact particle generation and damage to the backside of the wafer and/or the surface features. This can in turn, contribute to increases in particles transferred and premature failure of the system.

Consideration of the material properties of both the embossment (protrusion) and material being clamped (hardness, Young's modulus, fracture toughness, etc), the protrusion layout (areal density, pattern), clamp force, and the geometry of the protrusion itself can be made.

Figure 7:
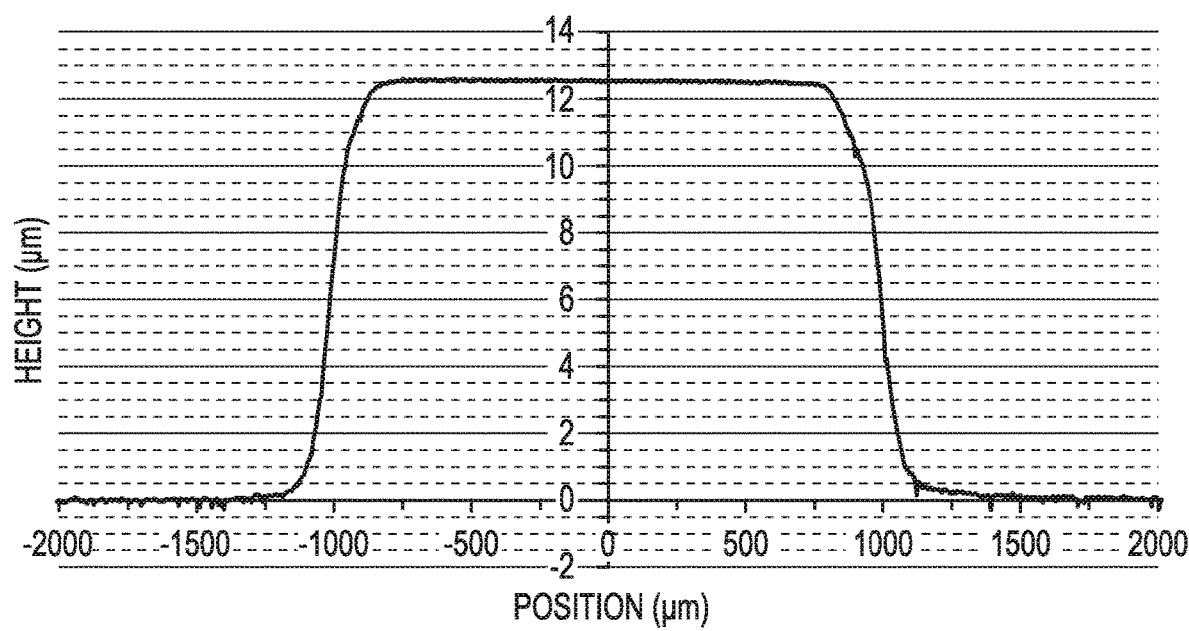
FIG. 7 illustrates a non-arcuate protrusion in a version of the invention.

The modeling and investigation show that it is important for the protrusion to have a substantially flat top (a flat plateau region) and appropriately radiused or rounded edges, it is possible to maximize the effective wafer contact area of a clamped wafer (which reduces the effective contact force), while reducing/minimizing the tendency to have a high concentration of forces at squared off protrusion edges (see FIG. 5b ("flat top with rounded edge") and FIG. 6). Radiused protrusion edges minimize the concentration of forces applied at the edge of the protrusion during clamping, which arise as the elastic wafer or substrate bends/sags from the clamping force in areas not supported by a protrusion (a function of the inter-protrusion/nearest neighbor distance R). A protrusion or other seal structure with a substantially flat top surface an with radiused edges results in a more uniform stress profile (uniform loading) across the entire contact area of the protrusion, and reduces the possibility that critical stresses for both the protrusion and wafer material being exceeded during the wafer clamping. This in turn, minimizes the potential for creating particles during the wafer clamping process. In addition to engineering the above described shape, the surface roughness of the wafer contact surface and edge profile is low (Ra<1 µm). An example of a profile of a protrusion based on this extensive research with a substantially flat topped profile (plateau) and radiused edges with low surface roughness of Ra<1 µm is shown in FIG. 7. In the example of FIG. 7, the ellipse describing the edge profile has a major axis dimension of X about 275 microns, and minor axis with Y about 1 microns, a plateau region of length L of about 1475 microns, and a Delta (Δ) of about 0.15 microns. A gas seal ring or lift pin seals could have a similar cross section profile.

In versions of the wafer or substrate contact surface which can be utilized for example on an electrostatic or other type of chuck, the top surface of the protrusion (or gas seal or lift pin seal) has a surface roughness $R_a$ of 1 micron or less and a value of (Δ*100)/L that is less than ±0.01. In some versions of the chuck, the top surface of the protrusion (or gas seal or lift pin seal) has a surface roughness $R_a$ of 1 micron or less and a value of (Δ*100)/L that is between ±(0.01 and 0.001).

The value of delta (Δ) and L can be determined using confocal laser microscopy. This technique can be used to measure the difference in height between the highest point $H_{max}$ of a protrusion at various points, L, moving away from the protrusion center or highest point. The value of delta (Δ) can vary and is not particularly limited provided that the top surface satisfies the relationship of (Δ*100)/L with a value that is less than ±0.01. In some versions of the chuck, the value of delta (Δ) can be less than 0.25. In other versions the value of delta can range from 0.05 to 0.25. Smaller values of delta (Δ) provide flatter top surfaces which can limit particle generation from a substrate that contacts the protrusion.

Figure 8:
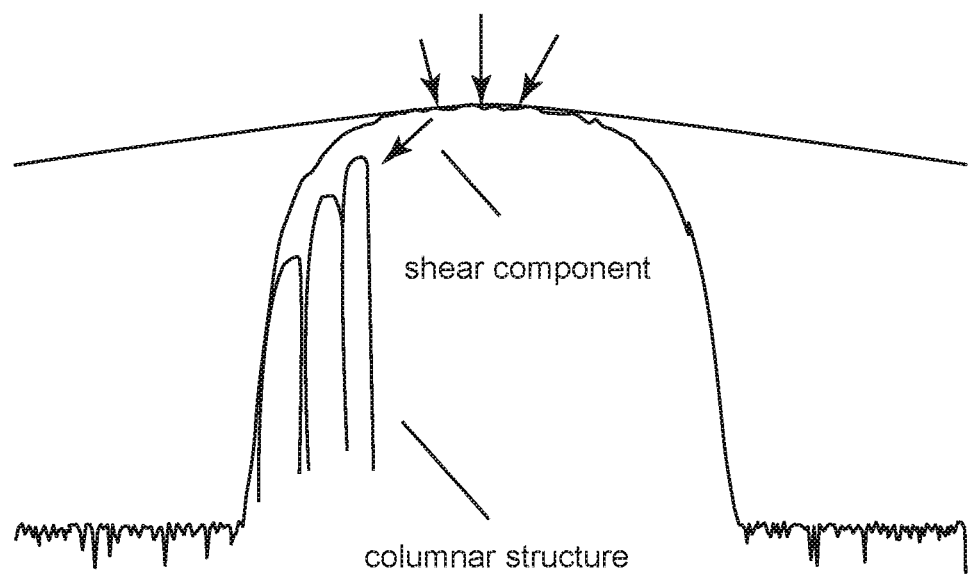
FIG. 8 shows an arcuate protrusion made from a material that has a columnar microstructure and illustrates the normal and shear forces exerted on the protrusion and columnar microstructure from a clamped substrate.

The investigations of this example have also shown that if instead of being substantially flat, the contact surface of the protrusion is arcuate (convex) as in FIG. 5a ("round top"), the arcuate nature of the contact surface (for protrusions of equivalent diameter, inter-protrusion spacing and clamp voltage) tends towards reducing the effective wafer contact area (increasing the effective force) and increasing the non-uniformity of the stress profile on the protrusion. This occurs because the wafer does not conform substantially to the top surface of the protrusion (a function of the elastic properties of the wafer/protrusion material system, inter-protrusion distance, clamp force etc.), and instead tends to concentrate the force over a smaller area (compared to a flat top protrusion), and increases the effective force on the protrusion in the contact zone. The greater the departure from a substantially flat contact surface towards a convex contact surface, the smaller the effective wafer to protrusion contact area becomes. The forces applied at the wafer-protrusion interface are not uniform across the entire contact area in this case, and are instead concentrated in a region centered on the zenith of the curved surface, dropping as one moves away. Contact force is highest and entirely normal at the zenith, and diminishes as one moves away (while introducing a shear stress component to the protrusion as illustrated in FIG. 8).

Further, if the force applied at the zenith exceeds the yield strength of the protrusion material and/or the wafer being clamped, damage to the protrusion and or the wafer can occur, resulting in particulation, that may become a self-perpetuating particle problem. While the force at the zenith of the protrusion is normal to the surface (arrow perpendicular to protrusion top that is downward facing arrows in FIG. 8), away from the zenith there is a shear component to the stress (side way facing arrows in FIG. 8), which may be particularly problematic in the case of coatings that are columnar in nature, which can also result in fracture of protrusion coatings and increased particulation for an arcuate protrusion. An arcuate protrusion surface introduces shear stresses that may cause some coatings, having a columnar structure as illustrated in FIG. 8, to fracture, leading to degradation in particle performance and reduction of the embossment system's (protrusion system) serviceable life.

The investigation in this example also showed that when the contact surface is concave, the effective contact area is also reduced (the wafer will not conform to contact the center of a concave protrusion) and the highest contact force occurs circumferentially on the raised areas at the outer edges of protrusions. Neither convex nor concave protrusion contact surfaces are ideal for high performance wafer contact surfaces. In the case of a squared off (non-radiused edge) protrusion, see FIG. 5 c, there is a higher contact force locally because beyond the edge, the wafer is not supported and it is a "boundary". This leads to a local concentration of the stress at the edge which can lead to particles from the substrate, the protrusion, or from a combination of both.

The investigations of this example have found that by maintaining a substantially flat top surface on the protrusions (flatness for the plateau region of a protrusion<0.01%), for a range of embossment sizes (100 µm-10 mm), shapes (square, elliptical/ovoid), inter-protrusion spacings, surfaces finishes (Ra<1 µm), the impact profile related contributions to particle can be minimized.

While of importance for all high performance wafer contact surfaces (for embossment or protrusion systems where hardness of the embossment or protrusion material is comparable to the hardness of the material being clamped) the optimized protrusion profile may play an even more important role in determining particle performance (have an increased impact) in the case of coatings that have a columnar microstructure. Maintaining a contact surface substantially flat (with radiused edges), ensures a more uniform loading (greater normal force as illustrated by the downward facing arrows in the diagram below) and less or no shear stress on the protrusion as show by the protrusion with a columnar microstructure as illustration in FIG. 9.

The protrusion profile design can improve particle performance by engineering applied loads to be more uniform on any contact surface, whether created using subtractive methods (lithographic patterning+bead blast; lithographic patterning+plasma or chemical etch), additive methods (3D printing, physical-mask-defined-features using PECVD/PVD processes), overcoated features built using additive or subtractive manufacturing methods.

Figure 11:
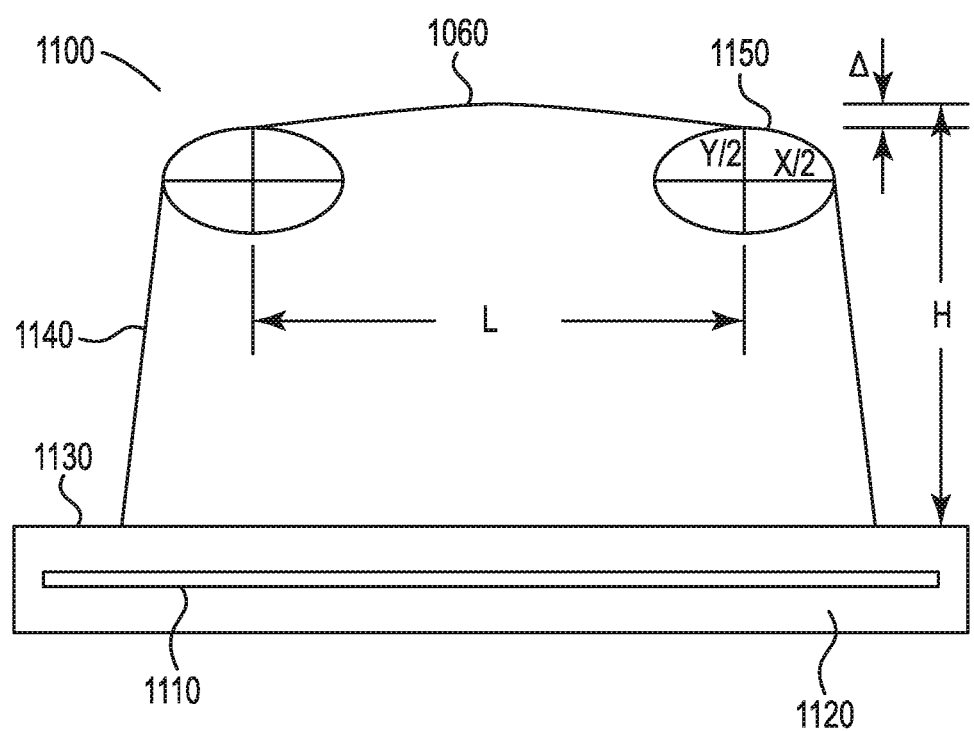
FIG. 11 illustrates an electrode in a ceramic base and another version of a protrusion with a substantially flat top surface, edge surfaces that are not perpendicular to the surface layer, and one or more ellipse describing the protrusion edge profile.

FIG. 10 Illustrates an electrode 1010 in a ceramic base 1020; and a surface layer 1030 of the electrostatic chuck that is activated by a voltage in the electrode (not shown) to form an electric charge that electrostatically clamps a substrate to the substrate contact surface of the illustrated portion of an electrostatic chuck. The wafer contact surface on the chuck includes the top surfaces of the protrusions. A portion of the surface layer 1030 of the electrostatic chuck with a representative protrusion 1000 is shown, the protrusion comprising a composition whose microstructure has crystallinity. The protrusion shown extends to an average height H above the surface layer surrounding the protrusion. Additional protrusions, seal ring, and lift pin seals (not shown) have their top surfaces at substantially the same level so that the chucked substrate is held substantially flat. The protrusions support the substrate upon the protrusions during electrostatic clamping of the substrate. A cross section of the protrusion shown has a structure characterized by a non-arcuate plateau shaped top surface 1060, an edge surface 1050, and a side surface 1040. The non-arcuate plateau shaped top surface of the protrusion can be characterized by a value L measured in microns and a flatness parameter $\Delta$ also measured in microns. The substantially flat top surface or plateau region of the protrusion of length L is shown in FIG. 10 and FIG. 11. The flatness parameter near the edge surface is also shown in FIG. 10 and FIG. 11. Both L and $\Delta$ can be determined by laser confocal microscopy. For example, using laser confocal microscopy, the center of the protrusion can be identified and the maximum height $H_{max}$ of the protrusion also identified. In FIG. 10 and FIG. 11 the highest point is shown as essentially being the center of the protrusion, but the highest point may not be at the center. Moving symmetrically away from the center of the protrusion or the highest point, the value L increases. At various points moving away from the protrusion center or highest point, confocal laser microscopy can be used to measure the difference in height between the highest point $H_{max}$ (or an imaginary plane at height $H_{max}$ and substantially parallel to the surface layer 1030 or 1130) and the surface of the protrusion (at each L/2) to obtain a value of delta ($\Delta$). The length of the top surface can be less than the diameter of the base of the protrusion (or gas seal or lift pin cross section) in contact with the surface layer as illustrated in FIG. 11. The top surface of the protrusion (or gas seal or lift pin seal) has a surface roughness $R_a$ of 1 micron or less and a value of ($\Delta$*100)/L that is less than ±0.01.

The edge surface 1050 of the protrusion (or gas seal or lift pin seal) is between the top surface 1060 and the side surface 1040 of the protrusion (or gas seal or lift pin seal) and the value of ($\Delta$*100)/L is equal to or greater than ±0.01 as determined by confocal laser microscopy. The edge surface profile can also be on or within a quadrant or portion thereof of an ellipse. The minor axis Y of this ellipse intersects an edge of the flat surface or a portion of the top surface of the protrusion (or gas seal or lift pin seal) where the value of ($\Delta$*100)/L is equal to or greater than ±0.01, and the minor axis apex of the ellipse lies along the top surface of the protrusion (or gas seal or lift pin seal). The value of Y/2 is 0.5 microns or less. The major axis X of the ellipse is substantially parallel to the top surface of the protrusion (or gas seal or lift pin seal) and electrostatic chuck surface layer 1030 and the value of X/2 is between 25 microns and 250 microns. The side surface of the protrusion is shown as being perpendicular or nearly perpendicular to the surface layer.

FIG. 11 also illustrates an electrode 1110 in a ceramic base 1120, and a surface layer 1130 of the electrostatic chuck that is activated by a voltage in the electrode (not shown) to form an electric charge that electrostatically clamps a substrate to the electrostatic chuck. A portion of the surface layer 1130 of the electrostatic chuck with a representative protrusion 1100 forming the wafer contact surface is shown, the protrusion comprising a composition whose microstructure has crystallinity. FIG. 11 illustrates that the protrusion has a substantially flat top surface 1160, edge surface 1150, and one or more ellipse describing the edge profile. The top surface 1160 has a surface roughness $R_a$ of 1 micron or less and a value of ($\Delta$*100)/L that is less than ±0.01. The side surface 1140 of the protrusion (or gas seal or lift pin seal) is not perpendicular to the surface layer illustrating that the "verticality" of the side surface can vary from 80 degrees to 175 degrees from the surface layer.

A cross section of the gas seal ring or lift pin seal can also have a structure characterized by a non-arcuate plateau shaped top surface, an edge surface, and a side surface; the non-arcuate plateau shaped top surface of the gas seal ring or lift pin seal has a length L in microns that is characterized by a flatness parameter $\Delta$ in microns, the top surface has a surface roughness $R_a$ of 1 micron or less and a value of ($\Delta$*100)/L that is less than ±0.01. The edge surface of the gas seal ring or lift pin seal can be between the top surface and the side surface of the gas seal ring or lift pin seal has an edge surface profile that lies on or within a quadrant or portion thereof of an ellipse, the minor axis Y of this ellipse intersects an edge of the flat surface or a portion of the top surface of the gas seal ring or lift pin seal where the value of ($\Delta$*100)/L is equal to or greater than ±0.01, and the minor axis apex of the ellipse lies along the top surface of the gas seal ring or lift pin seal, the value of Y/2 is 0.5 microns or less. The major axis X of the ellipse is substantially parallel to the top surface of the gas seal ring or lift pin seal (and the chuck's surface layer) and the value of X/2 is between 25 microns and 250 microns. The side surface of the gas seal ring or lift pin seal connects the edge surface and the surface layer.

Figure 9:
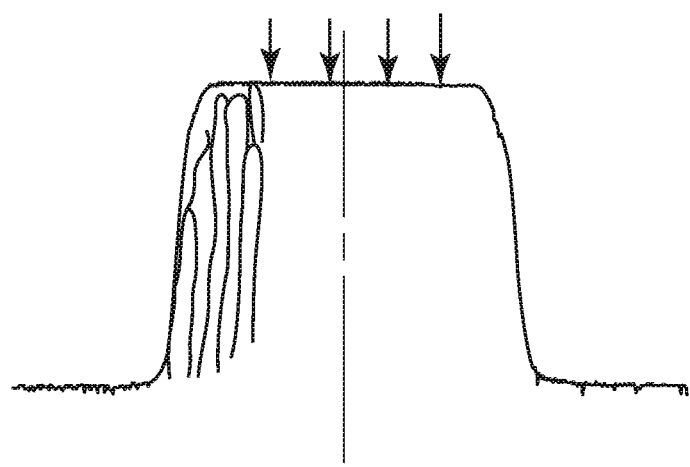
FIG. 9 shows a non-arcuate protrusion with a plateau top and columnar microstructure and illustrates the normal force exerted on the material by a clamped substrate (not shown).
Figure 12:
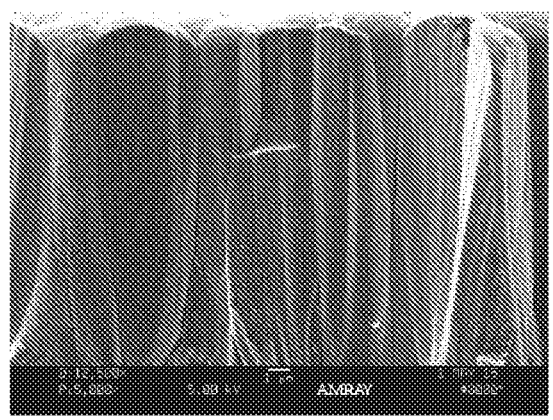
FIG. 12a and FIG. 12b are scanning electron micrographs illustrating columnar morphology that can be found in versions of protrusions atop an electrostatic chuck.
Figure 12B:
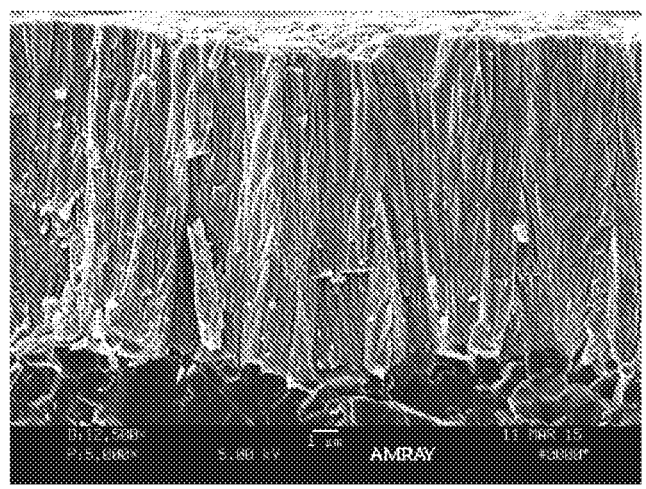

FIG. 12 are Scanning electron micrographs illustrating columnar morphology, as illustrated in FIG. 9, that can be found in versions of protrusions and seals structures of the substrate contact surfaces in versions of chucks described herein.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An electrostatic chuck comprising:
   an electrode in a ceramic base; and
   a surface layer of the electrostatic chuck activated by a voltage in the electrode to form an electric charge that electrostatically clamps a substrate to the electrostatic chuck; wherein
   the surface layer of the electrostatic chuck comprises a plurality of protrusions, the protrusions comprising a composition whose morphology is columnar or granular, and whose microstructure is crystalline or amorphous, the protrusions extending to an average height H above the surface layer surrounding the protrusions, the protrusions supporting the substrate upon the protrusions during electrostatic clamping of the substrate;
   a cross section of the protrusions has a structure characterized by a non-arcuate plateau shaped top surface, an edge surface, and a side surface; wherein the non-arcuate plateau shaped top surface of the protrusions has a length L in microns that is characterized by a flatness parameter $\Delta$ in microns, the top surface having a surface roughness $R_a$ of 1 micron or less and a value of $(\Delta*100)/L$ that is less than $\pm 0.01$;
   the edge surface of the protrusion is between the top surface and the side surface of the protrusion and has an edge surface profile that lies on or within a quadrant or portion thereof of an ellipse, the minor axis Y of the ellipse intersecting a portion of the top surface of the protrusion wherein the value of $(\Delta*100)/L$ is equal to or greater than $\pm 0.01$, and the minor axis apex of the ellipse lying along the top surface of the protrusion, the value of Y/2 is 0.5 microns or less;
   the major axis X of the ellipse is substantially parallel to the top surface or surface layer of the protrusion and the value of X/2 is between 25 microns and 250 microns; and
   the side surface of the protrusions connects the edge surface and the surface layer of the electrostatic chuck.

2. The electrostatic chuck of claim 1, wherein the protrusions comprise a material that is softer than silicon.

3. The electrostatic chuck of claim 1, where the protrusion side surface makes an angle with the surface layer, wherein the angle is between 80 degrees and 175 degrees.

4. The electrostatic chuck of claim 1 further comprising a gas seal ring or lift pin seal that extends to an average height H above the surface layer; wherein
   a cross section of the gas seal ring or lift pin seal has a structure characterized by a non-arcuate plateau shaped top surface, an edge surface, and a side surface; wherein the non-arcuate plateau shaped top surface of the gas seal ring or lift pin seal has a length L in microns that is characterized by a flatness parameter $\Delta$ in microns, the top surface having a surface roughness $R_a$ of 1 micron or less and a value of $(\Delta*100)/L$ that is less than $\pm 0.01$;
   the edge surface of the gas seal ring or lift pin seal is between the top surface and the side surface of the gas seal ring or lift pin seal and has an edge surface profile that lies on or within a quadrant or portion thereof of an ellipse, the minor axis Y of the ellipse intersecting a portion of the top surface of the gas seal ring or lift pin seal wherein the value of $(\Delta*100)/L$ is equal to or greater than $\pm 0.01$, and the minor axis apex of the ellipse lying along the top surface of the gas seal ring or lift pin seal, the value of Y/2 is 0.5 microns or less;
   the major axis X of the ellipse is substantially parallel to the top surface of the gas seal ring or lift pin seal and the value of X/2 is between 25 microns and 250 microns; and
   the side surface of the gas seal ring or lift pin seal connects the edge surface and the surface layer.

5. The electrostatic chuck of claim 4, wherein $\Delta$ value of 0.25 microns or less.

6. The electrostatic chuck of claim 1, wherein $\Delta$ has a value of 0.25 microns or less.

7. The electrostatic chuck of claim 1, wherein the protrusions comprise yttrium.

8. The electrostatic chuck of claim 1, wherein the protrusions comprise aluminum.

9. The electrostatic chuck of claim 1, wherein the protrusions comprise aluminum and oxygen.

10. The electrostatic chuck of claim 9, wherein the protrusions comprise aluminum oxynitride.

11. The electrostatic chuck of claim 1, wherein the protrusions comprise yttria.

12. The electrostatic chuck of claim 1, wherein the protrusions comprise alumina.

13. The electrostatic chuck of claim 1, wherein the protrusions comprise yttrium aluminum garnet.

14. The electrostatic chuck of claim 1, wherein the protrusions a height in the range of 5 microns to 20 microns.

15. The electrostatic chuck of claim 1, wherein $\Delta$ has a value of between 0.25 microns and 0.05 microns.

16. The electrostatic chuck of claim 1, wherein the protrusions have a center to center distance of between 1 micron and 20 microns.

17. The electrostatic chuck of claim 1, wherein the protrusions comprise a coating overlying a ceramic.

18. The electrostatic chuck of claim 1, wherein the protrusions comprise a composition having a columnar morphology as determined by scanning electron microscopy.

19. The electrostatic chuck of claim 1, wherein the protrusions comprise a composition having a crystalline morphology as measured by x-ray diffraction.

20. A wafer contact surface comprising: a plurality of protrusions, the protrusions comprising a composition whose morphology is columnar or granular, and whose microstructure is crystalline or amorphous, the protrusions extending to an average height H above the surface layer surrounding the protrusions, the protrusions supporting a wafer upon the protrusions during clamping of the wafer;
   a cross section of the protrusions having a structure characterized by a non-arcuate plateau shaped top surface, an edge surface, and a side surface; wherein the non-arcuate plateau shaped top surface of the protrusions has a length L in microns that is characterized by a flatness parameter $\Delta$ in microns, the top surface having a surface roughness $R_a$ of 1 micron or less and a value of $(\Delta*100)/L$ that is less than $\pm 0.01$; wherein
   the edge surface of the protrusion is between the top surface and the side surface of the protrusion has an edge surface profile that lies on or within a quadrant or portion thereof of an ellipse, the minor axis Y of the ellipse intersecting an edge of the flat surface of the protrusion wherein the value of $(\Delta*100)/L$ is equal to or greater than $\pm 0.01$, and the minor axis apex of the ellipse lying along the top surface of the protrusion, the value of Y/2 is 0.5 microns or less;

the major axis X of the ellipse is substantially parallel to the top surface of the protrusion and the value of X/2 is between 25 microns and 250 microns; and the side surface of the protrusions connects the edge surface and a surface layer of the wafer contact surface.

* * * * *